(12) United States Patent
Johnson et al.

(10) Patent No.: US 7,309,460 B2
(45) Date of Patent: Dec. 18, 2007

(54) PHOTOMASK CONTAINER

(75) Inventors: Michael L. Johnson, Minneapolis, MN (US); Barry L. Rauworth, Young America, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 11/286,696

(22) Filed: Nov. 23, 2005

(65) Prior Publication Data
US 2006/0108250 A1    May 25, 2006

Related U.S. Application Data

(60) Provisional application No. 60/630,907, filed on Nov. 24, 2004.

(51) Int. Cl.
| B28B 1/20 | (2006.01) |
| B28B 1/02 | (2006.01) |
| B28B 1/48 | (2006.01) |
| B65D 6/00 | (2006.01) |
| B65D 57/00 | (2006.01) |

(52) U.S. Cl. .............. 264/310; 264/152; 264/138; 264/248

(58) Field of Classification Search ............ 264/152, 264/157, 138, 308–310, 248–249
See application file for complete search history.

(56) References Cited

U.S. PATENT DOCUMENTS

| 3,132,909 A | 5/1964 | Josefson |
| 3,489,265 A | 1/1970 | Puente |
| 3,615,006 A | 10/1971 | Freed |
| T927,008 I4 | 10/1974 | Sherman et al. |
| 3,874,567 A * | 4/1975 | Collie ................... 222/499 |
| 4,511,038 A | 4/1985 | Miller et al. |
| 4,564,880 A | 1/1986 | Christ et al. |
| 4,624,557 A * | 11/1986 | Winn ..................... 355/75 |
| 4,776,462 A | 10/1988 | Kosugi et al. |
| 4,842,136 A | 6/1989 | Nakazato et al. |
| 4,892,223 A * | 1/1990 | DeMent ................. 220/404 |
| 5,269,156 A * | 12/1993 | van de Velde et al. .... 62/457.4 |
| 5,330,053 A | 7/1994 | Tabuchi et al. |
| 5,353,934 A | 10/1994 | Yamauchi |
| 5,399,398 A * | 3/1995 | Toshimitsu et al. ....... 428/35.7 |
| 5,474,177 A | 12/1995 | Abrams et al. |
| 5,922,267 A | 7/1999 | Brescia et al. |
| 5,950,817 A | 9/1999 | Iwamoto et al. |
| 6,982,057 B2 * | 1/2006 | King et al. ............. 264/255 |

FOREIGN PATENT DOCUMENTS

JP    2001225890 A    8/2001

* cited by examiner

*Primary Examiner*—Christina Johnson
*Assistant Examiner*—Matthew J. Daniels
(74) *Attorney, Agent, or Firm*—Patterson, Thuente, Skaar & Christensen, P.A.

(57) ABSTRACT

A container suitable for storing and transporting photomasks and including a container body, a cover, first and second cushions and left and right channels disposed in slots formed in the container body. In one embodiment, the container of this invention is formed in a one-piece design by rotomolding. The cover is subsequently separated from the body and machined so as to provide a slidingly sufficient seal and disposed therein.

10 Claims, 5 Drawing Sheets

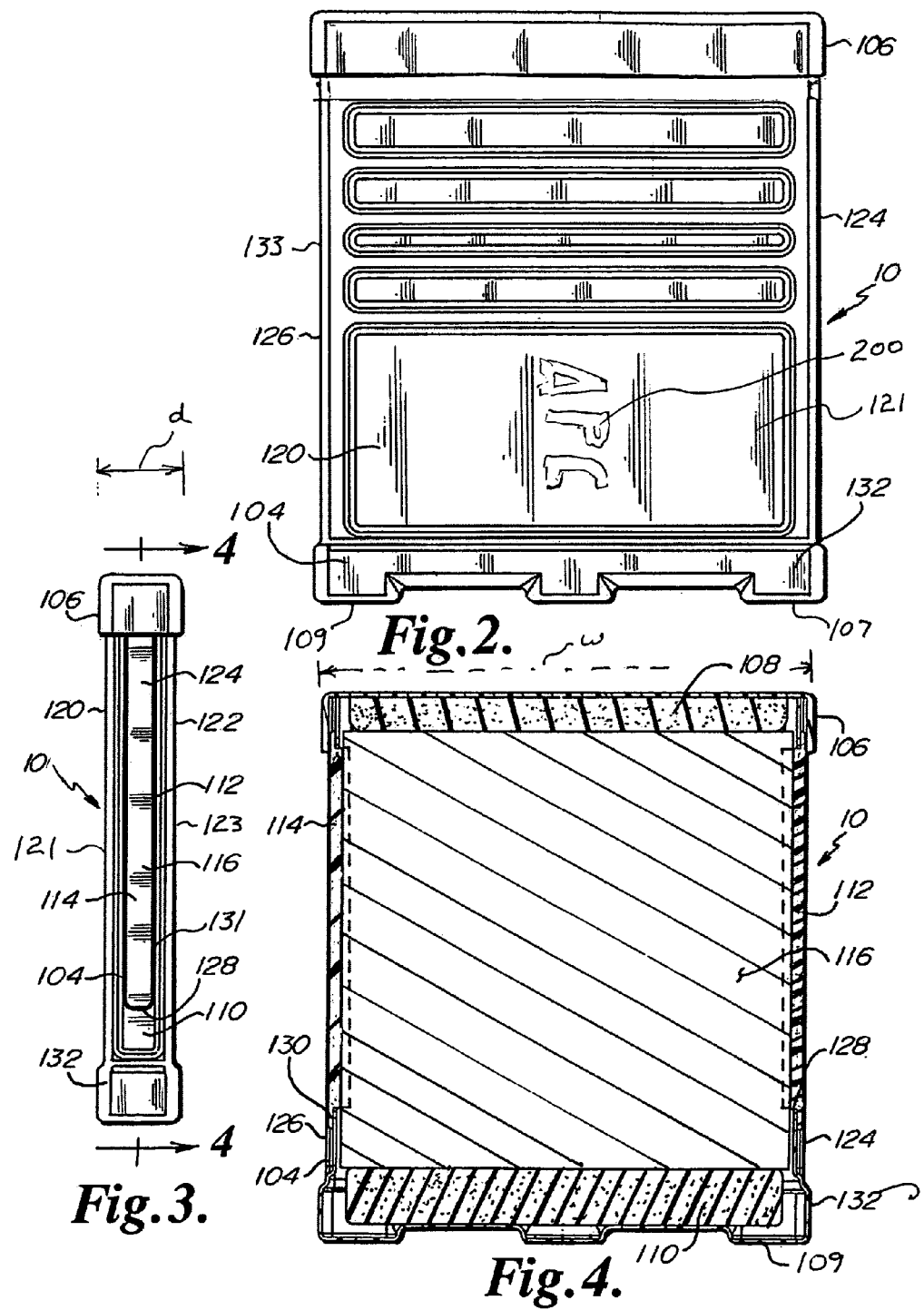

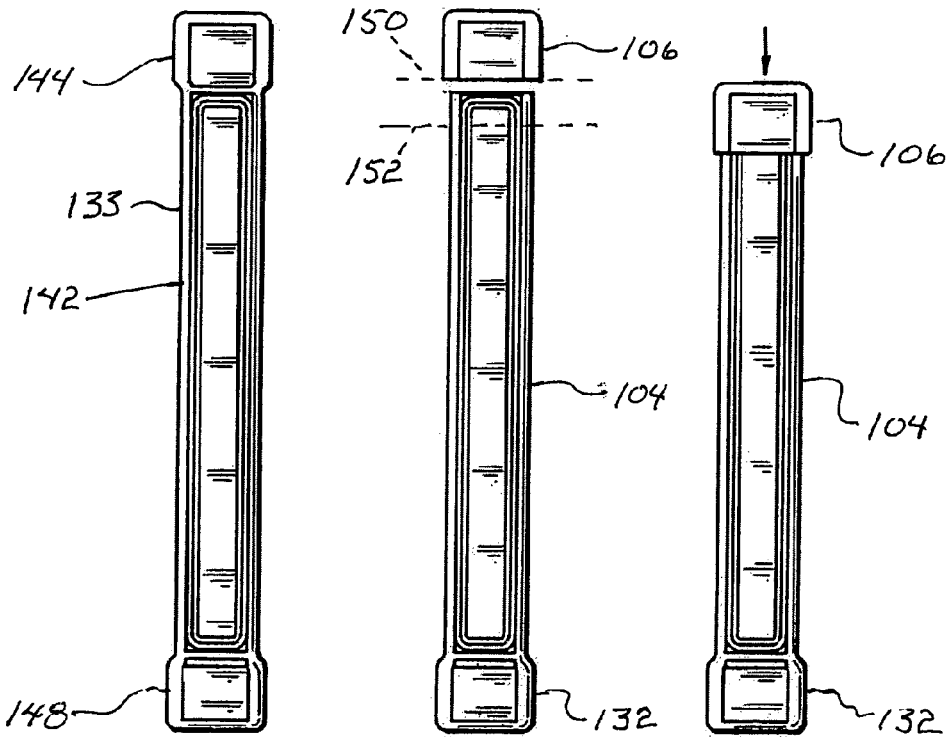
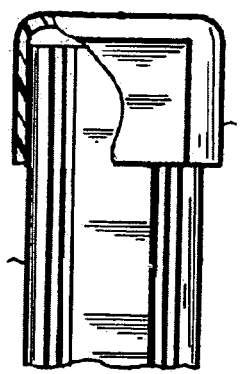
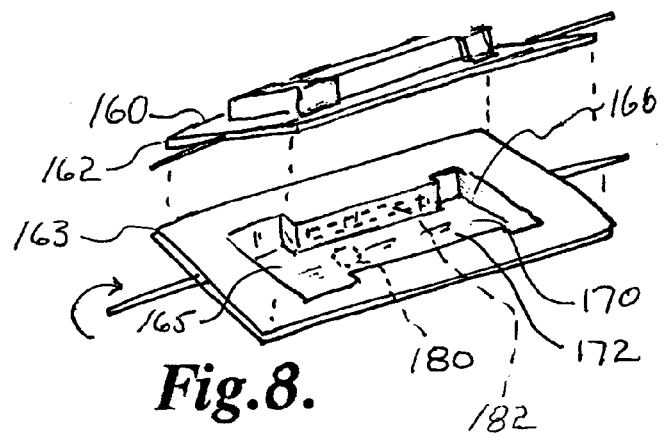
Fig. 3A. Fig. 3B. Fig. 3C.
Fig. 3D. Fig. 8.

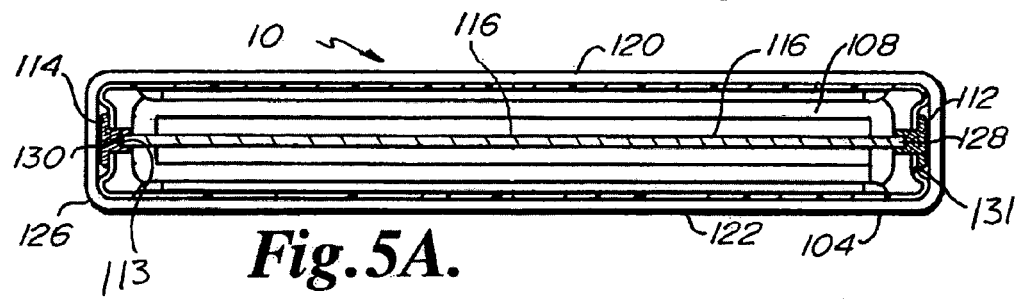
Fig. 5B.
Fig. 5A.
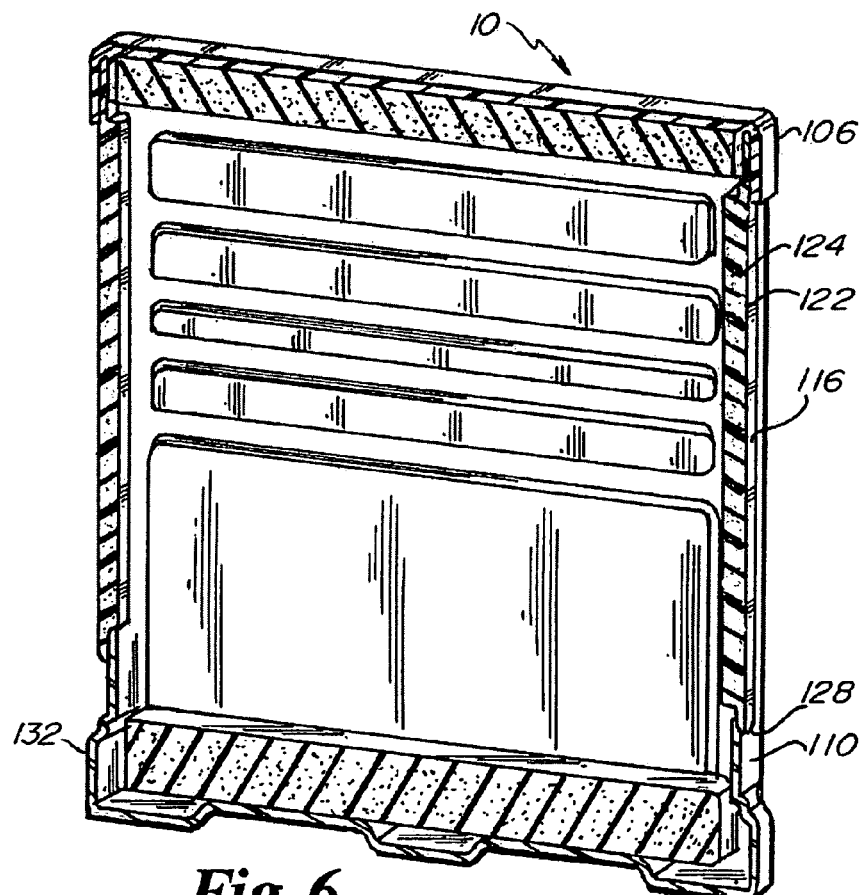
Fig. 6.

PHOTOMASK CONTAINER

RELATED APPLICATIONS

This application claims the benefit of U.S. Provisional Patent Application No. 60/630,907, entitled "Photomask Container", filed Nov. 24, 2004 and is hereby fully incorporated herein by reference.

FIELD OF THE INVENTION

This invention relates to containers and, in particular, this invention relates to reusable containers for storing and transporting fragile devices such as photomasks.

BACKGROUND OF THE INVENTION

Typically fragile substrate devices, such as larger photomasks, for example larger than 24 inches in length, are stored and shipped in prefabricated plastic boxes. Due to their size, these prefabricated plastic boxes, particularly for photomasks, are relatively expensive to make and are typically used only a single time. Therefore, it would be advantageous to the industry to provide containers suitable for photomasks, or other substrates, that are inexpensive to manufacture, yet protect the product from damage during transport and shipping.

SUMMARY OF THE INVENTION

The container herein is suitable for storing and transporting large, that is having a major dimension of at least 24 inches, photomasks. In one embodiment, the carrier of this invention is substantially a singular piece, which may be rotationally molded, then machined to separate the cover from the body. The instant container may be molded from a static dissipative material, such as polyethylene with an electrical conductor dispersed therein. Upper and lower cushions may be disposed within the instant container to secure the photomask disposed therein and to protect the photomask from damage due to mechanical shock. The upper and lower cushions may be made with a static dissipative synthetic resin, such as polyethylene foam with an electrical conductor dispersed therein. Channels may be machined in side inserts of the instant container to insure that photomasks slide easily into and out of the instant container.

There is provided a method for making a container of this invention and suitable for protectively securing a photomask therewithin, the method including forming a unitary container body, removing portions from two sides of the container body to form slots, inserting channels in the side slots, and forming a cover for the container. The lid or cover is preferably part of the original molded "body preform" which is cut into portions one or more times to form the body or container portion with an open end and the cover. The container body and/or the lid may be formed from a synthetic resin such as polyethylene, the polyethylene optionally comprising an electrostatically dissipative material. The slots may be formed by machining. The channels may be welded in the slots by a stream of heated air. Alternatively, the mold can have metal inserts to form the channels during the mold process.

There is also provided a method of disposing a photomask in a container, in which the container has a generally integral body having channels insertably sealed to the body, the method comprising inserting the photomask into a cavity of the body such that edges of the photomask contact the channels; and sealing the container with a lid.

It is a feature of the instant invention to provide a molded, one-piece container. It is an advantage of the foregoing feature that the provided container is more cheaply made and stronger, e.g., by the absence of welded seams.

It is a feature of this invention to provide one embodiment of the manufactured from polyethylene. It is an advantage of the foregoing feature that the instant container is more readily recycled.

It is yet another feature of this invention that the provided container is made using wide tolerance rotomolded synthetic resin with inserts from narrow tolerance-machine bar stock (e.g., polyethylene) to meet the functional requirements presented. It is an advantage of the foregoing feature that utilization of the bar stock provides a suitable container at a significantly lower cost than the fabricated designs of the prior art.

It is a feature of the instant invention that one embodiment thereof may be substantially entirely constructed from electrostatically dissipative material. It is an advantage of the foregoing feature that damage to the contents of the container due to electrostatic discharge may be greatly minimized or essentially eliminated.

It is yet another feature of this invention that the rotomolding process and design may be used to create a singularly uni-dimensional container. It is an advantage of the foregoing feature that the container created thereby may be cut to adjust the height thereof thereby customizing lengths to fit photomasks of varying heights and dimensions.

It is yet another feature of this invention that the body and lid of the provided container may be molded from the same tool. It is an advantage of the foregoing feature that the provided container is constructed at a greatly reduced cost.

It is yet another feature of this invention that containers may be made by a protocol of welding synthetic resins by a heated air stream. It is an advantage of the foregoing feature that containers for such items as photomasks and semiconductor wafers made by such a welding protocol are made more cheaply and are potentially stronger than containers made otherwise.

In certain embodiments the channels providing the grooves for supporting the photomask or other substrate can be inserted in the mold before the rotational molding process. Such inserts can have metal blanks to protect a preformed channel to be subsequently removed and can be made of a plastic or other compatible material that has a higher melt temperature that the resin used for formation of the container body.

These and other features and advantages of the instant invention will become apparent from the description which follows, when considered in view of the accompanying drawings.

BRIEF DESCRIPTION OF THE FIGURES

FIG. 2 is a front view of a body preform for making the container herein.

FIG. 3 is a side elevational view of the container of FIG. 1.

FIG. 3A is a side view of a body preform of the container of FIG. 1A.

FIG. 3B is a side view showing portions of the body preform severed to form the present container.

FIG. 3C is a side view of the present container.

FIG. 3D is a side view showing a closeup cutaway portion of the cover of FIG. 3C.

FIG. 4 is a cross sectional view of the container of FIG. 3 along lines 4-4.

FIG. 5A is a cross sectional view of the container of FIG. 1B along lines 5A-5A.

FIG. 5B is a top view of the cover of the instant container.

FIG. 6 is a cross sectional perspective view of the container similar to the view of FIG. 4.

FIG. 8 is a perspective view of a mold for molding the body preform.

Figure 1A:
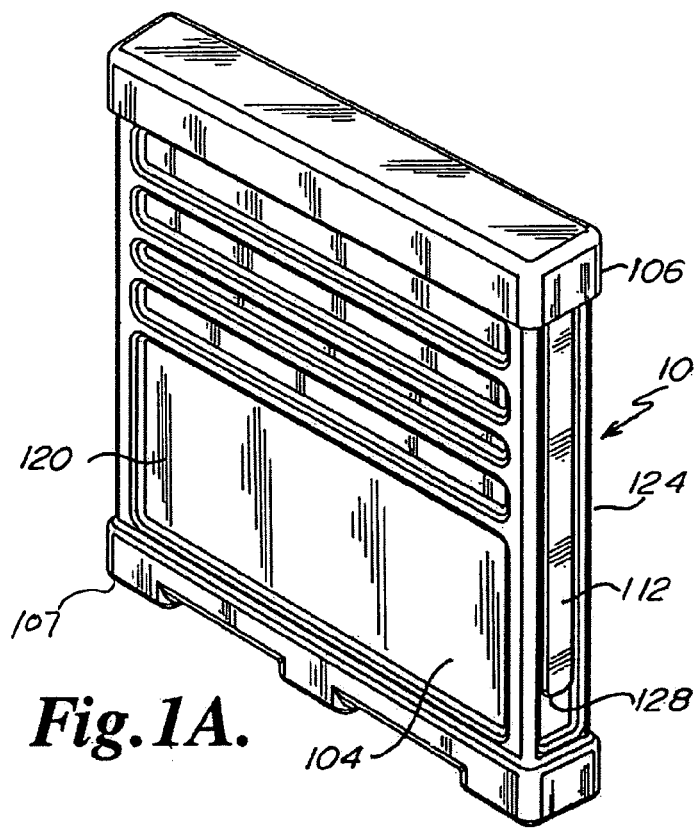
FIG. 1A is a perspective view of the container of this invention.
Figure 1B:
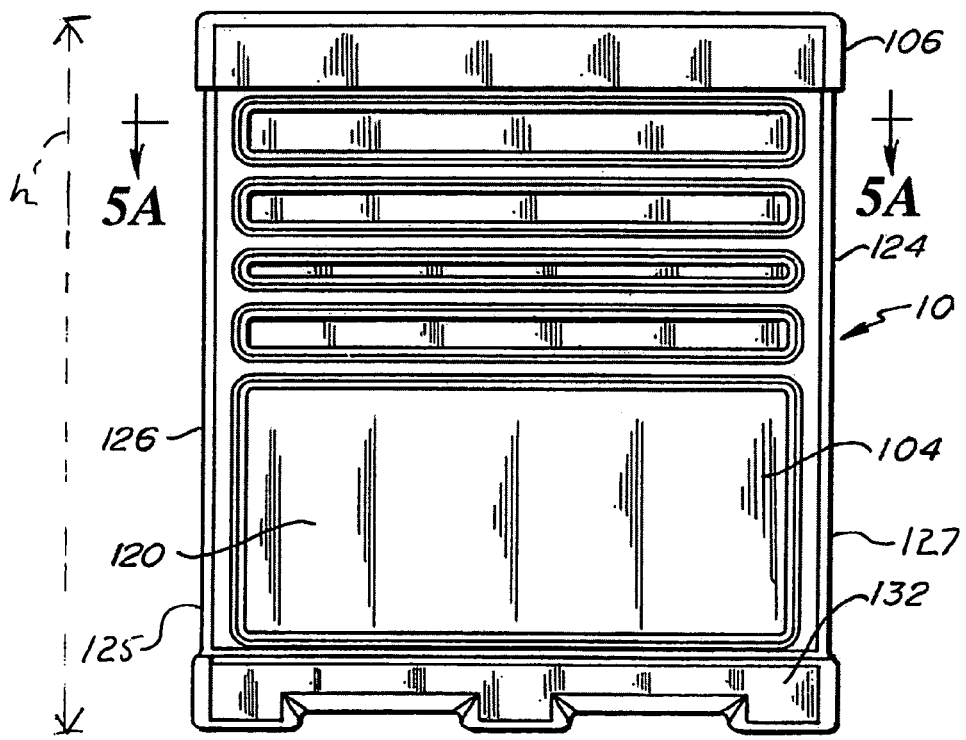
FIG. 1B is a front view of the container of FIG. 1A.
Figure 7:
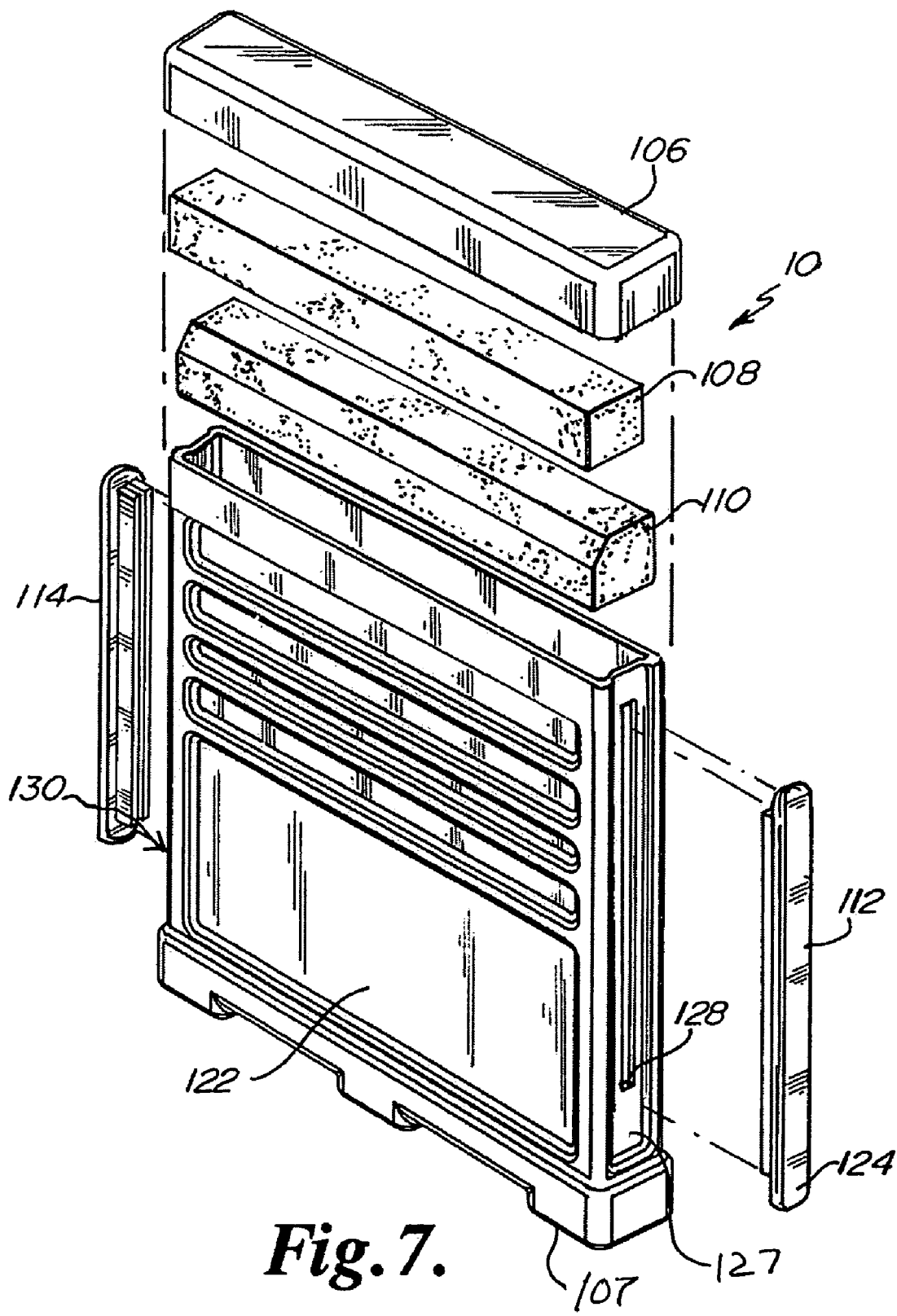
FIG. 7 is an exploded view of the container of FIG. 1.

It is understood that the above-described figures are only illustrative of the present invention and are not contemplated to limit the scope thereof.

DETAILED DESCRIPTION OF THE DRAWINGS

References to relative terms such as upper and lower, front and back, left and right, or the like, are intended for convenience of description and are not contemplated to limit the present invention, or its components, to any one positional or special orientation. All dimensions depicted in the figures may vary with a potential design and the intended use of a specific embodiment of this invention without departing from the scope thereof. Although the container is depicted upright with a height being the major dimension, in use the container may be primarily used with the major dimension and the photomask therein in the horizontal.

Each of the additional figures and methods disclosed herein may be used separately, or in conjunction with other features and methods, to provide improved containers and methods for making and using the same. Therefore, combinations of features and methods disclosed herein may not be necessary to practice the invention in its broadest sense and are instead disclosed merely to particularly describe representative and preferred embodiments of the instant invention.

One embodiment of the container of this invention is depicted in the figures generally at 10 and may include a body 104 or container portion, a cover 106, a closed bottom 107 with a bottom wall 109, respective first (upper) and second (lower) supports configured as cushions 108 and 110, first (left) and second (right) inserts 112 and 114 with channels 113. The foregoing elements cooperating to provide a container for safely and securely storing and transporting a photomask 116. The container has a height h, a depth d, and a width w.

The body 104, in turn, has respective front and back walls 120 and 122 with exterior surfaces 121, 123 and respective left and right sidewalls 124 and 126 with exterior surfaces 125 and 127. Left and right slots 128 and 130, respectively, may be machined or otherwise formed in the respective left and right sides 124 and 126. The inserts 112 and 114 are then placed in the left and right apertures configured as slots 128 and 130 and may be secured therein by being welded in place at weldments 131. In one method the inserts 112 and 114 are secured within the left and right slots 128 and 130 by a form of welding, in which a synthetic resin is melted in place by a stream of heated air. Other methods securing the channels 112 and 114 in the slots 128 and 130 include sonic welding and use of bonding agents or conventional fasteners such as screws, bolts, rivets. Moreover, the instant invention is contemplated to include processes which utilize welding a synthetic resin by means of a heated air stream and which are for manufacturing other substrate containers such as containers for semiconductor wafers.

When being made, the container 100 is unitarily formed, then the cover 106 is separated from the remainder of the container 100 and machined as appropriate so as to slidingly fit over the body portion in a snug, optionally air tight, manner. The other end of the body 104 includes an enlarged base 132. The base 132 provides stability and shock resistance to the container 100 during transport and use. By way of illustration and not limitation and referring to FIGS. 2, 3A-D, a body preform 133 made by molding. As shown in FIGS. 2 and 3A, the body preform has respective body, cover, and base portions 142, 144, and 148. The body preform is then cut along two planes indicated by lines 150 and 152 to form the instant container 100 with the body 104, cover 106, and base 132. The cut at 152 may be positioned to provide the container sized as desired in length. The portion of the body portion 142 completely severed from the remainder thereof (between the planes 150 and 152) is discarded. The cover 106, optionally machined to provide beveling, can then be disposed over the body 104 as indicated by the arrow 154. Referring now to FIG. 3D, the cover 106, when disposed as shown, ideally fits snugly over the body 104, thereby providing an air-tight seal protecting the enclosed photomask from ambient contamination and retaining the enclosed photomask in the container 100.

Because of the molded one-piece design, the instant container is made less expensively and is stronger than many containers of the prior art. One reason the instant container is stronger and more durable is that the instant container has welded seams. Additionally, all components of the instant container may be manufactured from a synthetic resin such as polyethylene. If polyethylene is utilized, the instant container is more readily recycled. Manufacturing the instant container combines the use of wide tolerance rotomolding with narrow-tolerance machined polyethylene bar stock to meet the functional requirements of the channels 112 and 114 at a significantly lower cost than a design, wherein the channels are separately molded. Additionally, the molded-in graphics optionally present are advantageous because they are not easily removed or scratched as opposed to the use of other labels, which are more easily scratched off or removed. Additionally, the entire container may be made from an electrostatically dissipative material, thereby preventing damage to the photomask stored and transported therein.

Referring to FIG. 8, a mold 160 suitable for rotationally molding the body preform 133 is illustrated. The mold has two halves 162, 163 inside surfaces 165 defining a cavity 166 having cavity portions 170, and an adjacent cavity midportion 172.

Resin, for example in bead form, is put into the open mold. The mold is closed, heated and rotated to disperse molten resin to cover the inside surfaces. The heat is removed, the mold allowed to cool, the mold is opened and the body preform is removed. The top cover is severed, the container portion cut to a desired size, and the slots in the sidewalls may be cut. The inserts, with channels machined or otherwise in place on the inserts, are attached to the slots, preferably by welding.

Additionally suitable graphics 200, such as graphics on a thin film substrate may be put in the cavity on one of the surfaces, such as 180 on FIG. 8, and affixed thereto. Then the molten resin can overmold the thin film and securely fix the graphics in place. Additionally, inserts may be secured in the mold such as at 182 having channels therein as an alternative to the cutting of slots and welding the inserts therein. In this option, the insert would preferably be formed of a polymer or other material that has a melt temperature higher than the resin being added to the mold for forming the body preform. Additionally, blanks may be necessary to cover the channel during the molding. Such can be subsequently removed after the plastic has hardened.

Because numerous modifications of this invention may be made without departing from the spirit thereof, the scope of the invention is not to be limited to the embodiments illustrated and described. Rather, the scope of the invention is to be determined by the appended claims and their equivalents.

What is claimed is:

1. A method for making a container for a photomask, comprising:
    forming a unitary container body having a top, a bottom, a front, a back and two sides;
    removing portions of the container body from the two sides to define side slots;
    inserting channels into the side slots;
    melting adjacent portions of the container body and channels to secure the channels in the side slots; and
    forming a cover, the cover fitting the container.

2. The method of claim 1, in which the container body is formed by one of injection molding, blow molding, and rotation molding.

3. The method of claim 1, in which the container body is formed from a synthetic resin.

4. The method of claim 3, in which the cover is formed by being separated from the container body.

5. The method of claim 1, in which the container body is formed from polyethylene.

6. The method of claim 1, in which the container body is formed from polyethylene, an electrical conductor dispersed in the polyethylene.

7. The method of claim 1, in which portions of the container body are removed by machining.

8. A method of manufacturing containers of a length, a width and of a selectable height for substrates, the container having a top wall, a bottom wall, a pair of side walls, a closed end, and open end, and a cover to extend over the open end, the method comprising the steps of:
    a) providing a rotational mold with inside surfaces defining a mold cavity with end cavity portions larger than an adjacent cavity midportion, the end cavity portion for forming an end portion on the body preform, the cavity midportion for forming a midportion on the body preform;
    b) molding the body preform by:
        i) insertion of resin into the mold;
        ii) heating the mold to melt the resin;
        iii) rotating the mold to disperse the molten resin along the inside surfaces;
        iv) allowing the molten resin to harden into the body preform with an end portion having a height and width greater that an adjacent midportion;
        v) removing the body preform from the mold;
    c) cutting through the body preform thereby severing at least a portion of the end portions;
    d) removal of elongate portions of each of the sidewalls to create apertures therein; and
    e) welding plastic inserts in said apertures.

9. The method of claim 8 further comprising the step of providing resin of sufficient quantity that body preform will have a substantially uniform thickness wall and said inside depth and width of the end portion is sized to slidingly engage the outside surface of the midportion.

10. The method of claim 8 further comprising the step of inserting a graphic on a substrate into the mold on a surface therein before heating the mold.

\* \* \* \* \*

UNITED STATES PATENT AND TRADEMARK OFFICE
CERTIFICATE OF CORRECTION

PATENT NO. : 7,309,460 B2
APPLICATION NO. : 11/286696
DATED : December 18, 2007
INVENTOR(S) : Michael L. Johnson and Barry L. Rauworth It is certified that error appears in the above-identified patent and that said Letters Patent is hereby corrected as shown below:

Column 2, line 8; please insert --container-- after "manufactured"
Column 2, line 48; please replace "that" with --than--
Column 3, line 61; please remove "," from the sentence after the word "welding"
Column 4, line 11; please insert --is-- after "perform 133"
Column 6, line 23; please remove "portions;" and replace with --portion.--

Signed and Sealed this

Twenty-ninth Day of July, 2008

JON W. DUDAS
*Director of the United States Patent and Trademark Office*